United States Patent
Wu et al.

(10) Patent No.: US 12,058,921 B2
(45) Date of Patent: Aug. 6, 2024

(54) DISPLAY MODULE AND CUTTING METHOD THEREOF, DISPLAY DEVICE

(71) Applicants: Chengdu BOE Optoelectronics Technology Co., Ltd., Sichuan (CN); BOE Technology Group Co., Ltd., Beijing (CN)

(72) Inventors: Huan Wu, Beijing (CN); Meishan Xu, Beijing (CN); Wanbin Li, Beijing (CN); Jie Xiang, Beijing (CN); Ruqin Zhang, Beijing (CN); Mengyang Xian, Beijing (CN)

(73) Assignees: BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 558 days.

(21) Appl. No.: 17/309,844

(22) PCT Filed: Aug. 6, 2020

(86) PCT No.: PCT/CN2020/107314
§ 371 (c)(1),
(2) Date: Jun. 23, 2021

(87) PCT Pub. No.: WO2021/023253
PCT Pub. Date: Feb. 11, 2021

(65) Prior Publication Data
US 2022/0029140 A1    Jan. 27, 2022

(30) Foreign Application Priority Data

Aug. 7, 2019   (CN) .......................... 201910725063.6

(51) Int. Cl.
*H01L 51/56*   (2006.01)
*B23K 26/38*   (2014.01)
(Continued)

(52) U.S. Cl.
CPC ............. *H10K 71/00* (2023.02); *B23K 26/38* (2013.01); *B23K 26/70* (2015.10); *B23K 26/702* (2015.10);
(Continued)

(58) Field of Classification Search
CPC ......... H10K 71/00; H10K 59/40; H10K 59/65
See application file for complete search history.

(56) References Cited

U.S. PATENT DOCUMENTS 4,251,709 A      2/1981  Shumacher
2020/0083477 A1*  3/2020  Kim ..................... B23K 26/364
(Continued)

FOREIGN PATENT DOCUMENTS

CN       101844275 A     9/2010
CN       104377223 A     2/2015
(Continued)

OTHER PUBLICATIONS

Machine translation, Zheng, Chinese Pat. Pub. No. CN210926064U, translation date: Jan. 12, 2024, Espacenet, all pages. (Year: 2024).*
(Continued)

*Primary Examiner* — Victoria K. Hall
(74) *Attorney, Agent, or Firm* — Nath, Goldberg & Meyer; Joshua B. Goldberg (57) ABSTRACT

The present disclosure provides a cutting method of a display module, including: providing a display module to be cut, the display module to be cut including a display panel and a spacing layer on the display panel, and the display panel including a region to be cut, the spacing layer being provided with a first through hole exposing the region to be cut, and the first through hole being provided therein with an encapsulation adhesive; and performing laser cutting on the display module to be cut at a position of the region to be cut so as to remove the region to be cut to form a cutting groove.

(Continued)

In the laser cutting, at least part of the encapsulation adhesive is melted and covers a sidewall of the cutting groove.

13 Claims, 5 Drawing Sheets

(51) Int. Cl.
    *B23K 26/70* (2014.01)
    *H01L 27/32* (2006.01)
    *H01L 51/52* (2006.01)
    *H10K 50/844* (2023.01)
    *H10K 59/40* (2023.01)
    *H10K 59/65* (2023.01)
    *H10K 59/80* (2023.01)
    *H10K 71/00* (2023.01)

(52) U.S. Cl.
    CPC .......... *H10K 50/844* (2023.02); *H10K 59/40* (2023.02); *H10K 59/65* (2023.02); *H10K 59/87* (2023.02); *H10K 59/873* (2023.02); *H10K 71/851* (2023.02)

(56) References Cited

U.S. PATENT DOCUMENTS

| 2020/0119292 | A1* | 4/2020 | Li  | H10K 77/111 |
| 2020/0185660 | A1* | 6/2020 | Kim | H10K 59/8722 |
| 2020/0328375 | A1* | 10/2020 | Won | H10K 71/00 |
| 2022/0246884 | A1* | 8/2022 | Yan | H10K 50/844 |

FOREIGN PATENT DOCUMENTS

| CN | 105353910 A    |   | 2/2016  |          |
| CN | 107919364 A    |   | 4/2018  |          |
| CN | 109144312 A    |   | 1/2019  |          |
| CN | 109739380 A    |   | 5/2019  |          |
| CN | 110405362 A    |   | 11/2019 |          |
| CN | 210926064 U    | * | 7/2020  | ............ H01L 27/32 |
| EP | 0278942 A1     |   | 8/1988  |          |
| IN | 108475323 A    |   | 8/2018  |          |
| JP | H03142087 A    |   | 6/1991  |          |
| JP | 2015067330 A   |   | 4/2015  |          |
| WO | 2008/129277 A1 |   | 10/2008 |          |

OTHER PUBLICATIONS

Office Action dated Dec. 1, 2020 issued in corresponding Chinese Application No. 201910725063.6.

* cited by examiner

```
┌─────────────────────────────────────────────────────────────────┐
│  providing a display module to be cut, the display module to be cut including a  │
│   display panel and a spacing layer on the display panel, and the display panel   │──S110
│  including a region to be cut, the spacing layer being provided with a first through│
│  hole corresponding to a position of the region to be cut, and the first through hole│
│            being provided therein with an encapsulation adhesive                  │
└─────────────────────────────────────────────────────────────────┘
                                    │
                                    ▼
┌─────────────────────────────────────────────────────────────────┐
│   performing laser cutting on the display module to be cut at a position of the   │
│   region to be cut, such that the region to be cut is removed to form a cutting   │──S120
│  groove, while at least part of the encapsulation adhesive is melted and falls into│
│            the cutting groove and covers the sidewall of the cutting groove       │
└─────────────────────────────────────────────────────────────────┘
```

DISPLAY MODULE AND CUTTING METHOD THEREOF, DISPLAY DEVICE

CROSS-REFERENCE TO RELATED APPLICATION

This is a National Phase Application filed under 35 U.S.C. 371 as a national stage of PCT/CN2020/107314, filed Aug. 6, 2020, an application claiming the benefit of Chinese Application No. 201910725063.6, filed Aug. 7, 2019, the content of each of which is hereby incorporated by reference in its entirety.

TECHNICAL FIELD

The present application relates to the field of display technology, and particularly to a display module and a cutting method thereof, and a display device.

BACKGROUND

Laser cutting refers to a process in which a material to be cut is irradiated with a high-power-density laser beam, so that the material is quickly heated to a vaporization temperature and evaporated to form a hole, and as the beam moves with respect to the material to be cut, holes are continuously formed to constitute a slit with a narrow width (e.g., about 0.1 mm), thereby completing the cutting of the material.

In the display field, laser cutting is a common means, and according to actual requirements, laser cutting may be performed on a substrate to form holes with various shapes. However, during the process of laser cutting, the substrate may be damaged, so that water vapor and oxygen may permeate into the substrate from the damaged portion and diffuse, resulting in dark-spot defects of the substrate.

SUMMARY

In one aspect, the present disclosure provides a cutting method of a display module, including steps of: providing a display module to be cut, the display module to be cut including a display panel and a spacing layer on the display panel, the display panel including a region to be cut, the spacing layer being provided with a first through hole exposing the region to be cut, and the first through hole being provided therein with an encapsulation adhesive; and performing laser cutting on the display module to be cut at a position of the region to be cut so as to remove the region to be cut to form a cutting groove, wherein in the laser cutting, at least part of the encapsulation adhesive is melted and covers a sidewall of the cutting groove.

In some embodiments, the step of providing a display module to be cut includes: providing a groove to be cut in the region to be cut of the display panel, wherein the groove to be cut is recessed from a surface of the display panel without penetrating the display panel. The step of performing laser cutting on the display module includes: performing laser cutting on the display module to be cut at a position of the groove to be cut so as to form the cutting groove penetrating the display panel.

In some embodiments, the cutting method further includes a step of blowing air to the region to be cut from a side of the spacing layer facing away from the display panel, wherein the step of blowing air is performed at least during the laser cutting.

In some embodiments, in the laser cutting, an amount of the at least part of the encapsulation adhesive is controlled by adjusting a laser irradiation time and a laser intensity.

In some embodiments, the cutting method further includes a step of curing the encapsulation adhesive covering the sidewall of the cutting groove to encapsulate the sidewall of the cutting groove.

In some embodiments, the step of curing the encapsulation adhesive covering the sidewall of the cutting groove includes: performing ultraviolet heating and exposure on the encapsulation adhesive covering the sidewall of the cutting groove.

In some embodiments, the encapsulation adhesive includes glass frit adhesive.

In some embodiments, the glass frit adhesive includes glass frit, an oxidizer, a filler, and a binder.

In some embodiments, in the step of providing a display module to be cut, the encapsulation adhesive is attached to an inner wall of the first through hole, and a thickness of the encapsulation adhesive in a radial direction of the first through hole is less than 10 μm.

In some embodiments, the display module further includes a touch substrate on the spacing layer, and the touch substrate is provided with a second through hole communicating with the first through hole.

In some embodiments, the spacing layer is an optical clear adhesive layer.

In some embodiments, in the step of providing a display module to be cut, the first through hole penetrating the spacing layer is formed in the spacing layer, the encapsulation adhesive is provided in the first through hole, and then the spacing layer with the first through hole formed therein is disposed on the display panel.

In another aspect, the present disclosure provides a display module, including: a display panel provided with a cutting groove; and a spacing layer on the display panel. The spacing layer is provided with a first through hole communicating with the cutting groove, and an encapsulation adhesive at least covers a sidewall of the cutting groove.

In some embodiments, the spacing layer is an optical clear adhesive layer, and the encapsulation adhesive covers both a sidewall of the first through hole and the sidewall of the cutting groove.

In some embodiments, a touch substrate is on the spacing layer, and a second through hole communicating with the first through hole is provided in the touch substrate.

In another aspect, the present disclosure provides a display device including the above display module.

In another aspect, the present disclosure provides a method of manufacturing a display screen, including: cutting a display module by using the above cutting method; and attaching a glass cover plate to the display module subjected to the cutting.

BRIEF DESCRIPTION OF DRAWINGS

The accompanying drawings, which constitute a part of the specification, are provided for further understanding of the present disclosure, and for explaining the present disclosure together with the following specific implementations, but not intended to limit the present disclosure. In the drawings.

DETAILED DESCRIPTION

Specific embodiments of the present disclosure will be described in detail below in conjunction with the accompanying drawings. It should be understood that the embodiments to be described herein are only intended to illustrate and explain the present disclosure, but not to limit the present disclosure.

Figure 1:
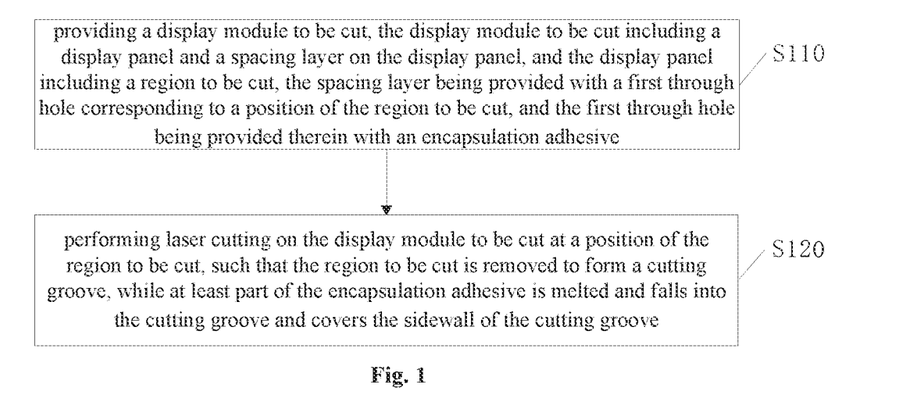
FIG. 1 is a flowchart of a cutting method according to an embodiment of the present disclosure.

The embodiments of the present disclosure provide a cutting method of a display module, and FIG. 1 is a flowchart of the cutting method according to an embodiment of the present disclosure. As shown in FIG. 1, the cutting method according to an embodiment of the present disclosure includes the following steps S10 and S120.

In step S110, a display module to be cut is provided. The display module to be cut includes a display panel and a spacing layer on the display panel. The display panel includes a region to be cut. A first through hole corresponding to a position of the region to be cut (e.g., exposing the region to be cut) is formed in the spacing layer, and an encapsulation adhesive is formed in the first through hole.

Figure 2:
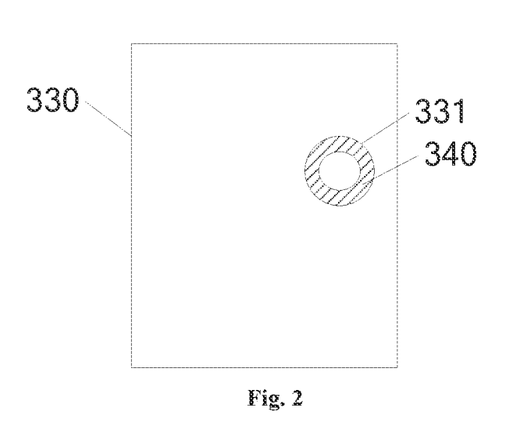
FIG. 2 is a top view of a spacing layer according to an embodiment of the present disclosure.

FIG. 2 is a top view of a spacing layer according to an embodiment of the present disclosure. As shown in FIG. 2, in this step, a first through hole 331 may be formed in the spacing layer 330 and an encapsulation adhesive 340 may be formed in the first through hole 331 in advance, and then the spacing layer 330 with the first through hole 331 formed therein may be formed on the display panel. Alternatively, the spacing layer 330 may be formed on the display panel, and then the first through hole 331 may be formed in the spacing layer 330. The encapsulation adhesive 340 may be disposed on a sidewall of the first through hole 331, and the encapsulation adhesive 340 may fill the first through hole 331 completely or may not fill the first through hole 331 completely. In a case where the encapsulation adhesive 340 does not fill the first through hole 331 completely, the volume of the encapsulation adhesive 340 should be sufficient such that the encapsulation adhesive 340 can cover the entire sidewall of the cutting groove after being melted. In some embodiments, the spacing layer having the first through hole 331 and the encapsulation adhesive 340 may be prepared in advance, and then the spacing layer may be directly placed on the display panel, so as to prevent the display panel from being damaged by the forming process of the first through hole 331.

In step S120, laser cutting is performed on the display module to be cut at a position of the region to be cut, such that the region to be cut is removed to form a cutting groove, while at least part of the encapsulation adhesive is melted and falls into the cutting groove and covers the sidewall of the cutting groove.

In this step, when the region to be cut is subjected to laser cutting, the laser may irradiate onto the display panel from a side of the spacing layer away from the display panel. Further, the laser irradiation time and the laser intensity may be adjusted to control the melting degree of the encapsulation adhesive 340 (i.e., to control the amount of the at least part of the encapsulation adhesive), so that the melted encapsulation adhesive 340 can cover the entire sidewall of the cutting groove.

In the cutting method of the display module according to an embodiment of the present disclosure, the first through hole corresponding to the position of the region to be cut is formed in the spacing layer, and the encapsulation adhesive 340 is formed in the first through hole. When the display module to be cut is cut at the position of the region to be cut, the encapsulation adhesive 340 is melted by the heat of the cutting laser, and due to the action of gravity, the melted encapsulation adhesive 340 flows down along the sidewall of the cutting groove and covers the sidewall of the cutting groove, thereby completing the encapsulation of the sidewall of the cutting groove. The encapsulation adhesive 340 on the sidewall can block the impact of an external force on the sidewall of the cutting groove, so that cracks on the sidewall of the cutting groove, which allow water vapor and oxygen to permeate into the display panel and thus lead to dark-spot defects, are prevented.

Figure 3:
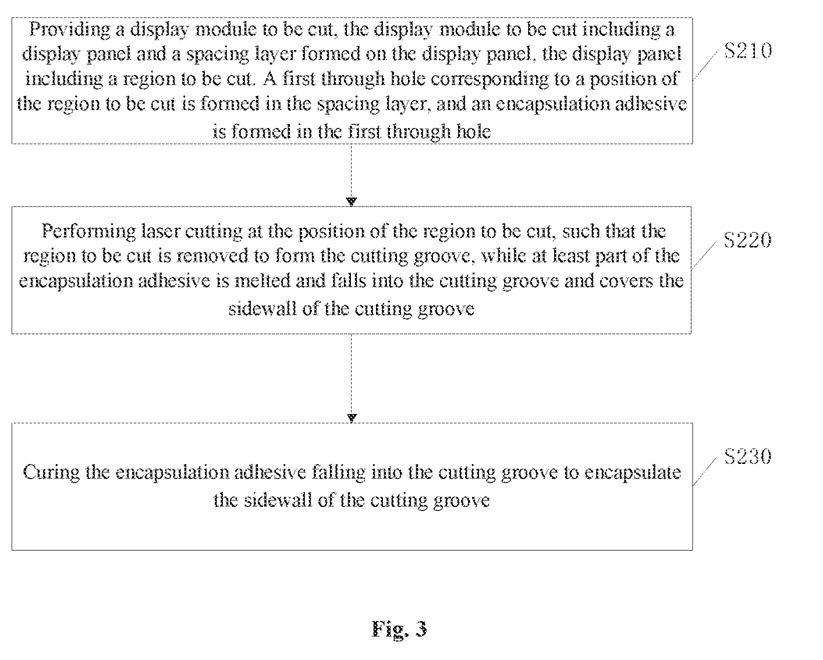
FIG. 3 is a flowchart of a cutting method of a display module according to an embodiment of the present disclosure.

FIG. 3 is a flowchart of a cutting method of a display module according to an embodiment of the present disclosure, and as shown in FIG. 3, the cutting method according to an embodiment of the present disclosure includes the following steps S210 to S230.

In step S210, a display module to be cut is provided. The display module to be cut includes a display panel and a spacing layer formed on the display panel. The display panel includes a region to be cut. A first through hole 331 corresponding to a position of the region to be cut (e.g., exposing the region to be cut) is formed in the spacing layer, and an encapsulation adhesive 340 is formed in the first through hole 331.

In this step, the region to be cut may be a region at which a device such as a camera or an infrared sensor needs to be disposed on the display panel. Through laser cutting, a cutting groove is formed in this region, such that the device such as a camera or an infrared sensor is disposed in the cutting groove. In some embodiments, before the laser cutting is performed on the region to be cut, a groove to be cut is formed in the region to be cut, and the groove to be cut is recessed from a surface of the display panel without penetrating the display panel. The step of performing laser cutting on the display module to be cut at the position of the region to be cut includes: performing laser cutting on the display module to be cut at the position of the groove to be cut so as to form the cutting groove penetrating the display panel.

Figure 4A:
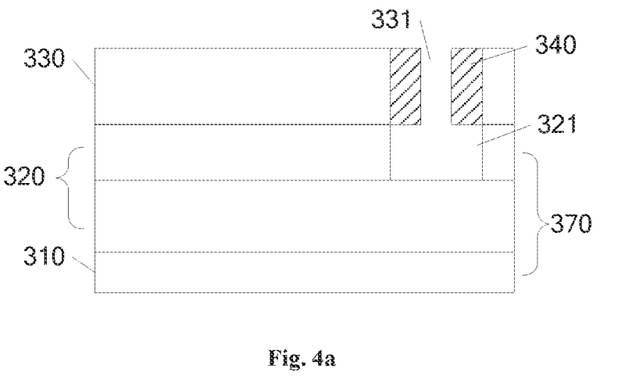
FIG. 4a is a schematic diagram illustrating a display module before cutting according to an embodiment of the present disclosure.
Figure 4B:
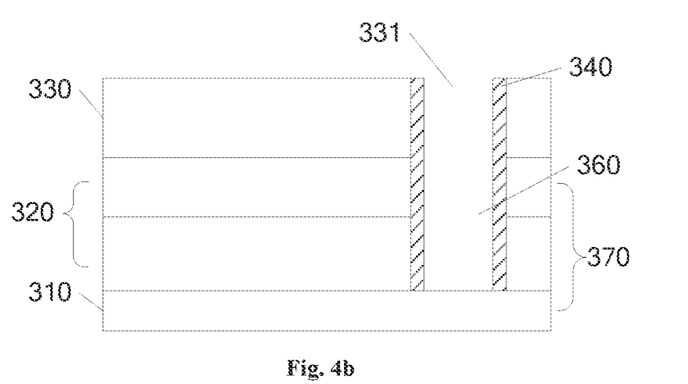
FIG. 4b is a schematic diagram illustrating a display module after cutting according to an embodiment of the present disclosure.

Specifically, FIG. 4a is a schematic diagram of the display module before cutting according to an embodiment of the present disclosure, and FIG. 4b is a schematic diagram of the display module after cutting according to an embodiment of the present disclosure. As shown in FIGS. 4a and 4b, the display panel 370 may include a display substrate 310, the display substrate 310 may be an organic electroluminescent (OLED) display substrate, the display panel 370 further includes an encapsulation layer 320 disposed on the display substrate 310, and the encapsulation layer 320 includes a plurality of film layers such as an organic film layer and an inorganic film layer. The spacing layer 330 is formed on a side, away from the display substrate, of the film layer farthest from the display substrate 310. Before the cutting, an opening may be reserved in at least part of the film layers of the encapsulation layer 320 to form a groove 321 to be cut. When performing subsequent laser cutting, the display module is cut at the groove 321 to be cut by using laser, and the remaining to-be-cut film layers of the display panel 370 are cut through, thereby obtaining a cut groove 360 which penetrates the display panel 370.

In step S220, laser cutting is performed at the position of the region to be cut, such that the region to be cut is removed to form the cutting groove 360, in the meanwhile at least part of the encapsulation adhesive 340 is melted and falls into the cutting groove 360 and covers the sidewall of the cutting groove 360. In some embodiments, air is blown to the region to be cut from the side of the spacing layer 330 facing away from the display panel 370 while performing laser cutting on the region to be cut to form the cutting groove 360.

In this step, the flowing speed of the encapsulation adhesive 340 may be controlled by adjusting the intensity of air blowing during the laser cutting, so that the melted encapsulation adhesive 340 covers the sidewall of the cutting groove 360 more uniformly, and meanwhile, the powder produced in the cutting process can be blown off by the air blowing.

In some embodiments, the encapsulation adhesive 340 includes glass frit adhesive. In some embodiments, the glass frit adhesive is formed by mixing glass frit, a filler and a binder in a certain ratio, where the glass frit may include glass powder or an oxidizer (e.g., $V_2O_5$, $P_2O_5$, $Fe_2O_3$, $SiO_3$, etc.), the binder includes diethylene glycol-butyl ether, and the filler includes ceramic powder, refractory oxides and the like. The glass frit adhesive has low viscosity and good fluidity, and the cured glass frit adhesive has the advantages of heat resistance, cold resistance, high-temperature aging resistance, ultraviolet radiation resistance and the like. It should be noted that the encapsulation adhesive 340, the filler and the binder are not limited to the above specific materials, and the embodiments of the present disclosure merely take the above-mentioned materials as examples for description.

In some embodiments, the encapsulation adhesive 340 in the first through hole 331 is attached to the inner wall of the first through hole, and before the laser cutting is performed on the region to be cut, the thickness of the encapsulation adhesive 340 is less than 10 μm along a radial direction of the first through hole 331; and a through hole is formed in the center of the encapsulation adhesive, so that the laser can penetrate the through hole in the center of the encapsulation adhesive 340 to cut the region to be cut while melting the encapsulation adhesive 340.

Figure 5:
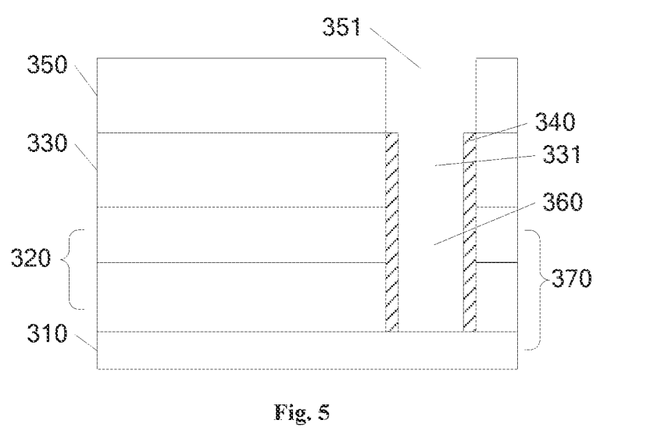
FIG. 5 illustrates a display module provided with a touch substrate according to an embodiment of the present disclosure.

FIG. 5 illustrates a display module provided with a touch substrate according to an embodiment of the present disclosure, and as shown in FIG. 5, the display module further includes a touch substrate 350 disposed on the spacing layer 330, and a second through hole 351 communicating with the first through hole 331 is formed in the touch substrate 350.

In some embodiments, the spacing layer 330 is an optical clear adhesive (OCA) layer. Specifically, the OCA layer has high light transmittance, can obtain high bonding strength, has the advantage of small curing shrinkage, and is suitable for bonding optical devices. Therefore, the display panel 370 and the touch substrate 350 are bonded into a whole by the OCA layer. The second through hole 351 is prepared in the touch substrate 350 in advance before the touch substrate 350 and the display panel 370 are bonded, the second through hole 351 communicates with the first through hole 331, and when laser cutting is performed, laser can be irradiated to the encapsulation adhesive 340 in the first through hole 331 through the second through hole 351, so as to melt the encapsulation adhesive 340. Furthermore, the encapsulation adhesive 340 covers the whole inner wall of the first through hole 331. By adjusting the amount of the encapsulation adhesive 340, a part of the encapsulation adhesive 340 may remain and still cover the inner wall of the first through hole 331 while the encapsulation adhesive 340 covers the cutting groove 360 when the encapsulation adhesive 340 is melted, thereby blocking the heat of laser from diffusing to the OCA layer and avoiding the OCA layer from overflowing.

In some embodiments, by adjusting the proportion of the adhesive material of the encapsulation adhesive 340 to make the encapsulation adhesive 340 be in a semi-molten state or a molten state before the laser cutting, the time for melting the encapsulation adhesive 340 by the laser can also be shortened.

In step S230, the encapsulation adhesive 340 falling into the cutting groove 360 is cured to encapsulate the sidewall of the cutting groove 360.

Specifically, the curing manner includes, but is not limited to, natural curing, thermal curing, ultraviolet exposure (UV) curing, and the like.

Figure 6A:
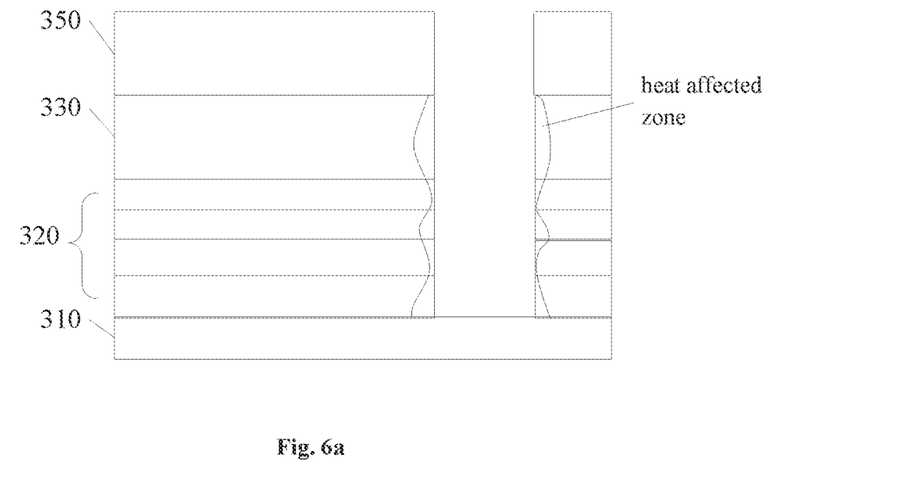
FIG. 6a is a schematic diagram illustrating a heat affected zone of a display module in which an encapsulation adhesive is not formed, according to an embodiment of the present disclosure.
Figure 6B:
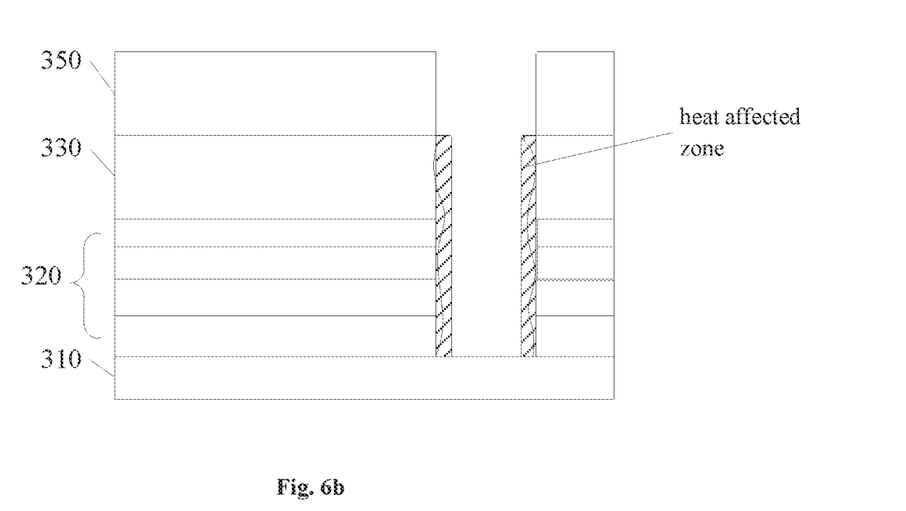
FIG. 6b is a schematic diagram illustrating a heat affected zone of a display module in which an encapsulation adhesive is formed, according to an embodiment of the present disclosure.

By adopting the cutting method of the display module according to an embodiment of the present disclosure, the first through hole 331 corresponding to the position of the region to be cut is formed in the spacing layer 330, and the encapsulation adhesive 340 is formed in the first through hole 331. When the display module to be cut is cut, the encapsulation adhesive is melted by the heat of the cutting laser, and due to the action of gravity, the melted encapsulation adhesive flows down along the sidewall of the cutting groove 360 and covers the sidewall of the cutting groove 360, thereby completing the encapsulation of the sidewall of the cutting groove 360. The encapsulation adhesive on the sidewall can block the impact of an external force on the sidewall of the cutting groove 360, so that cracks on the sidewall of the cutting groove 360, which allow water vapor and oxygen to permeate into the display panel 370 and thus lead to dark-spot defects, are prevented. Further, the encapsulation adhesive 340 covering the sidewall of the cutting groove 360 may also absorb heat produced during laser cutting and block heat diffusion. FIG. 6a is a schematic diagram of a heat affected zone of the display module in which an encapsulation adhesive is not formed according to an embodiment of the present disclosure, and FIG. 6b is a schematic diagram of a heat affected zone of the display module in which an encapsulation adhesive is formed according to an embodiment of the present disclosure. As shown in FIGS. 6a and 6b, in the display module shown in FIG. 6a, the laser directly affects each film layer around the cutting groove 360 since no encapsulation adhesive blocks the laser, and the heat affected zone of each film layer is relatively large. The organic film layer is more easily deformed by heat, and therefore, the heat affected zone of the organic film layer is larger, and the heat affected zone of the inorganic film layer is smaller. However, in the display module shown in FIG. 6b, due to the thermal insulation effect of the encapsulation adhesive 340, the heat affected zone is distributed in the encapsulation adhesive 340, and the heat affected zone of each film layer of the display substrate 310 is significantly reduced.

The embodiments of the present disclosure further provide a display module, which is obtained by cutting the display module to be cut by the cutting method. As shown in FIG. 5, the display module according to an embodiment of the present disclosure includes a display panel 370 and a spacing layer 330 on the display panel 370. The display panel 370 is provided with a cutting groove 360 therein. The spacing layer 330 is provided therein with a first through hole 331 corresponding to and communicating with the cutting groove 360, and the encapsulation adhesive 340 covers at least the sidewall of the cutting groove 360.

By adopting the display module according to an embodiment of the present disclosure, the encapsulation adhesive 340 is provided on the sidewall of the cutting groove 360. The encapsulation adhesive 340 can block the impact of an external force on the sidewall of the cutting groove 360, so that cracks on the sidewall of the cutting groove 360, which allows water vapor and oxygen to permeate into the display panel 370 and thus lead to dark-spot defects, are prevented.

In some embodiments, the spacing layer is an OCA layer.

The encapsulation adhesive 340 covers both the sidewall of the first through hole 331 and the sidewall of the cutting groove 360.

In some embodiments, a touch substrate 350 is disposed on the spacing layer 330, and a second through hole 351 communicating with the first through hole 331 is disposed in the touch substrate 350.

The embodiments of the present disclosure further provide a display device, which includes the above display module.

The display device may be any product or component with a display function, such as an electronic paper, a mobile phone, a tablet computer, a television, a monitor, a laptop computer, a digital photo frame, a navigator, or the like.

Figure 7:
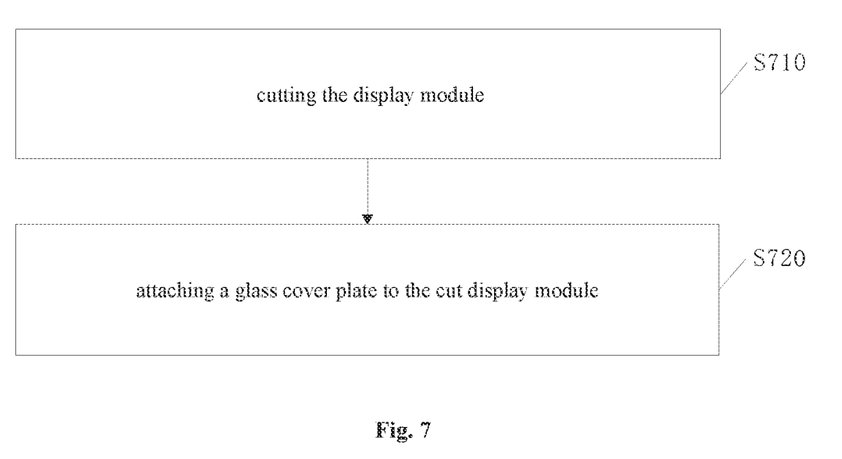
FIG. 7 is a flowchart of a method of manufacturing a display screen according to an embodiment of the present disclosure.

The embodiments of the present disclosure further provide a method of manufacturing a display screen. Referring to FIG. 7, the method includes; cutting the display module by using the cutting method of the display module (step S710); and attaching a glass cover plate to the cut display module (step S720).

It can be understood that the foregoing embodiments are merely exemplary embodiments used for describing the principle of the present disclosure, but the present disclosure is not limited thereto. Those of ordinary skill in the art may make various variations and improvements without departing from the spirit and essence of the present disclosure, and these variations and improvements shall also fall into the protection scope of the present disclosure.

What is claimed is:

1. A cutting method of a display module, comprising steps of:
   providing a display module to be cut, the display module to be cut comprising a display panel and a spacing layer on the display panel, and the display panel comprising a region to be cut, the spacing layer being provided with a first through hole exposing the region to be cut, and the first through hole being provided therein with an encapsulation adhesive; and
   performing laser cutting on the display module to be cut at a position of the region to be cut so as to remove the region to be cut to form a cutting groove,
   wherein in the laser cutting, at least part of the encapsulation adhesive is melted and covers a sidewall of the cutting groove.

2. The cutting method of claim 1, wherein the step of providing a display module to be cut comprises: providing a groove to be cut in the region to be cut of the display panel, wherein the groove to be cut is recessed from a surface of the display panel and has a depth less than a thickness of the display panel, and
   the step of performing laser cutting on the display module comprises:
   performing laser cutting on the display module to be cut at a position of the groove to be cut so as to form the cutting groove penetrating the display panel.

3. The cutting method of claim 1, further comprising a step of:
   blowing air to the region to be cut from a side of the spacing layer facing away from the display panel,
   wherein the step of blowing air is performed at least during the laser cutting.

4. The cutting method of claim 1, wherein in the laser cutting, an amount of the at least part of the encapsulation adhesive is controlled by adjusting a laser irradiation time and a laser intensity.

5. The cutting method of claim 1, further comprising a step of:
   curing the encapsulation adhesive covering the sidewall of the cutting groove to encapsulate the sidewall of the cutting groove.

6. The cutting method of claim 5, wherein the step of curing the encapsulation adhesive covering the sidewall of the cutting groove comprises:
   performing ultraviolet heating and exposure on the encapsulation adhesive covering the sidewall of the cutting groove.

7. The cutting method of claim 1, wherein the encapsulation adhesive comprises glass frit adhesive.

8. The cutting method of claim 7, wherein the glass frit adhesive comprises glass frit, an oxidizer, a filler, and a binder.

9. The cutting method of claim 1, wherein in the step of providing a display module to be cut, the encapsulation adhesive is attached to an inner wall of the first through hole, and a thickness of the encapsulation adhesive in a radial direction of the first through hole is less than 10 μm.

10. The cutting method of claim 1, wherein the display module further comprises a touch substrate on the spacing layer, and the touch substrate is provided with a second through hole communicating with the first through hole.

11. The cutting method of claim 1, wherein the spacing layer is an optical clear adhesive layer.

12. The cutting method of claim 1, wherein in the step of providing a display module to be cut:
   the first through hole penetrating the spacing layer is formed in the spacing layer, the encapsulation adhesive is provided in the first through hole, and
   then the spacing layer with the first through hole formed therein is on the display panel.

13. A method of manufacturing a display screen, comprising:
   cutting a display module by using the cutting method of claim 1; and
   attaching a glass cover plate to the display module subjected to the cutting.

* * * * *

UNITED STATES PATENT AND TRADEMARK OFFICE
CERTIFICATE OF CORRECTION

| | |
|---|---|
| PATENT NO. | : 12,058,921 B2 |
| APPLICATION NO. | : 17/309844 |
| DATED | : August 6, 2024 |
| INVENTOR(S) | : Huan Wu et al. |

It is certified that error appears in the above-identified patent and that said Letters Patent is hereby corrected as shown below:

On the Title Page

Item [73], delete the first Assignee "BOE OPTOELECTRONICS TECHNOLOGY CO., LTD.," and replace with "Chengdu BOE Optoelectronics Technology Co., Ltd".

Signed and Sealed this
Tenth Day of September, 2024

Katherine Kelly Vidal
*Director of the United States Patent and Trademark Office*